United States Patent
Chuang et al.

(10) Patent No.: US 9,640,943 B2
(45) Date of Patent: May 2, 2017

(54) EXTERNAL CAVITY FABRY-PEROT LASER

(75) Inventors: Zuon-Min Chuang, Taoyuan (TW);
Rang-Chen Yu, San Jose, CA (US);
Domenico Di Mola, Fremont, CA (US);
Sung-Ping Huang, Hsinchu (TW)

(73) Assignee: Oplink Communications, LLC, Fremont, CA (US)

( * ) Notice: Subject to any disclaimer, the term of this patent is extended or adjusted under 35 U.S.C. 154(b) by 0 days.

(21) Appl. No.: 14/417,747

(22) PCT Filed: Jul. 30, 2012

(86) PCT No.: PCT/IT2012/000235
§ 371 (c)(1),
(2), (4) Date: Jun. 25, 2015

(87) PCT Pub. No.: WO2014/020618
PCT Pub. Date: Feb. 6, 2014

(65) Prior Publication Data
US 2015/0311669 A1    Oct. 29, 2015

(51) Int. Cl.
*H04B 10/27* (2013.01)
*H04J 14/00* (2006.01)
(Continued)

(52) U.S. Cl.
CPC ........ *H01S 5/0078* (2013.01); *H01S 3/08027* (2013.01); *H01S 5/0064* (2013.01);
(Continued)

(58) Field of Classification Search
CPC .... H01S 5/0064; H01S 5/0656; H01S 5/1021; H01S 5/141; H01S 5/146; H01S 5/0078;
(Continued)

(56) References Cited

U.S. PATENT DOCUMENTS 6,434,175 B1 *   8/2002   Zah ................. H01S 3/2383
                                                              372/20
7,065,300 B1 *   6/2006   Walker ............. H01S 5/0265
                                                              359/263

(Continued)

OTHER PUBLICATIONS

International Search Report/Written Opinion for PCT/IT2012/000235 issued by European Patent Office on Jul. 11, 2013, 16 pages.

*Primary Examiner* — Ken N Vanderpuye
*Assistant Examiner* — Dibson Sanchez
(74) *Attorney, Agent, or Firm* — Jeffrey K. Jacobs

(57) ABSTRACT

Methods, systems, and apparatus, for an external cavity FP laser. In one aspect, an apparatus is provided that includes a FP laser diode; a Faraday rotator (FR) coupled to receive an optical output of the FP laser diode and that rotates a polarization of the optical output; an optical fiber coupled at a first end to receive the output of the FR; a WDM filter coupled to a second end of the optical fiber to receive the optical signal from the optical fiber; and a FRM coupled directly or indirectly to an output of the WDM filter, wherein an optical output of the WDM filter is partially reflected by the FRM such that the polarization of a reflected beam is rotated, and wherein the reflected optical signal then passes through the FR with its polarization being rotated by the FR before it is injected back into the FP laser diode.

9 Claims, 5 Drawing Sheets

(51) Int. Cl.

| | | |
|---|---|---|
| *H01S 5/00* | (2006.01) | |
| *H01S 5/024* | (2006.01) | |
| *H01S 5/065* | (2006.01) | |
| *H01S 5/10* | (2006.01) | |
| *H01S 5/14* | (2006.01) | |
| *H04B 10/572* | (2013.01) | |
| *H04J 14/02* | (2006.01) | |
| *H01S 3/08* | (2006.01) | |
| *H04B 10/50* | (2013.01) | |
| *H04J 14/06* | (2006.01) | |

(52) U.S. Cl.
CPC ........ *H01S 5/02438* (2013.01); *H01S 5/0656* (2013.01); *H01S 5/1021* (2013.01); *H01S 5/141* (2013.01); *H01S 5/146* (2013.01); *H04B 10/501* (2013.01); *H04B 10/572* (2013.01); *H04J 14/025* (2013.01); *H04J 14/0246* (2013.01); *H04J 14/0247* (2013.01); *H04J 14/0252* (2013.01); *H04J 14/0282* (2013.01); *H04J 14/06* (2013.01); *H01S 2301/14* (2013.01); *H01S 2301/163* (2013.01)

(58) Field of Classification Search
CPC ............. H01S 3/08027; H01S 5/02438; H01S 2301/14; H01S 2301/163; H04J 14/0282; H04J 14/06; H04J 14/0246; H04J 14/0247; H04J 14/025; H04J 14/0252; H04B 10/572; H04B 10/501
USPC .................... 398/65, 58–64, 66–73
See application file for complete search history.

(56) References Cited

U.S. PATENT DOCUMENTS

| | | | | |
|---|---|---|---|---|
| 7,269,352 | B2* | 9/2007 | Jung | H04J 14/02 398/79 |
| 7,672,598 | B1* | 3/2010 | Campillo | H04B 10/50 398/183 |
| 8,073,341 | B2* | 12/2011 | Byun | H04B 10/0799 398/182 |
| 2004/0067059 | A1* | 4/2004 | Song | H04J 14/02 398/82 |
| 2005/0135449 | A1 | 6/2005 | Sorin et al. | |
| 2005/0276615 | A1* | 12/2005 | Ranganath | H04B 10/505 398/183 |
| 2006/0083515 | A1* | 4/2006 | Hann | H04J 14/02 398/87 |
| 2006/0256831 | A1* | 11/2006 | Volodin | G02B 27/0944 372/102 |
| 2007/0264021 | A1* | 11/2007 | Li | H04J 14/02 398/135 |
| 2008/0025726 | A1* | 1/2008 | Welch | G02B 6/12004 398/79 |
| 2008/0279557 | A1 | 11/2008 | Park et al. | |
| 2010/0316378 | A1* | 12/2010 | Yeh | H01S 5/4062 398/58 |
| 2010/0316383 | A1* | 12/2010 | Kim | H04J 14/0282 398/79 |
| 2011/0038635 | A1 | 2/2011 | Bai | |
| 2011/0110665 | A1* | 5/2011 | Rhy | B82Y 20/00 398/79 |
| 2011/0129227 | A1* | 6/2011 | Wen | H01S 5/0687 398/82 |
| 2011/0176813 | A1* | 7/2011 | Kim | H04B 10/516 398/147 |
| 2012/0141128 | A1 | 6/2012 | Bai | |
| 2012/0213519 | A1* | 8/2012 | Lee | H04B 10/506 398/72 |
| 2012/0269516 | A1* | 10/2012 | Liu | H04B 10/2503 398/72 |
| 2013/0004175 | A1* | 1/2013 | Silveira | H04B 10/516 398/79 |
| 2014/0029945 | A1* | 1/2014 | Martinelli | H04B 10/532 398/58 |
| 2014/0064727 | A1* | 3/2014 | Presi | H04B 10/2572 398/49 |
| 2014/0205293 | A1 | 7/2014 | Lin et al. | |
| 2015/0063803 | A1* | 3/2015 | Ciaramella | H04J 14/0246 398/49 |

* cited by examiner

EXTERNAL CAVITY FABRY-PEROT LASER

BACKGROUND

Wave Division Multiplexing (WDM) technology has been widely used in optical fiber communications in order to increase the transmission capacity for point to point connection through a single optical fiber. Various conventional WDM laser technologies have been developed and widely deployed over the years. Solutions suitable for Dense WDM (DWDM) applications and with high speed modulation performance at 10 G or above are generally desired for efficient use of optical fibers to deliver the overwhelmingly increasing data transmission demands, especially in long haul and metro markets. Fixed wavelength externally modulated distributed feedback (DFB) lasers, e.g., electro-absorption modulated lasers (EML), and wavelength tunable lasers are currently dominating the market deployment. Tunable lasers have gradually increased its share in the market with the advantage of being colorless for better inventory management. The sophisticated and costly fabrication process tunable lasers may potentially pose a limit to its continuing increase of market share.

WDM technology is not only desired for point to point transmission in long haul and metro markets but also desirable for multipoint to multipoint connections through a single fiber in aggregation, sometimes referred to as a WDM Passive optical network (WDM-PON) system. Both EML and tunable lasers are typically too expensive for WDM-PON systems. Cost effective colorless laser solutions are desired for WDM-PON applications and there has been substantial research and development efforts in the past pursuing such solutions. Among the earlier efforts, an Optical Network Unit with injection locked Fabry-Perot (FP) laser and reflective optical semiconductor amplifier (RSOA) based on a seed light coming from a high power broadband light source sliced by the Arrayed Waveguide Grating multiplexer/demultiplexer (AWG MUX/DEMUX) or from a continuous wave (CW) WDM light source have been proposed. Other options have been proposed including a self-seeding architecture that uses the light emission from the RSOA in the ONU as its own seed light by placing a partial reflective mirror at the output of the AWG MUX to feedback some of the light emission from the RSOA itself. This approach virtually forms an external cavity laser that has a cavity length as long as the length of the fiber that connects the ONU to the passive WDM MUX node of the WDM-PON system. Concern of stability for such a long external cavity laser has been studied using a Faraday rotator mirror (FRM) to stabilize the polarization through the long optical fiber. The self-seeding architecture greatly simplified the WDM-PON system since it limits the light seeding configuration to the ONU service area between the ONUs and passive node, which is beneficial for the seamless deployment of the WDM-PON service and facilitates the potential convergence between future WDM-PON and the existing time division multiplexing-PON (TDM-PON) architectures. Nonetheless, the relevant solutions proposed so far are not able to provide satisfactory transmission performance in speed and distance.

SUMMARY

Systems, methods and apparatus are proposed for an external cavity FP laser structure and a WDM-PON architecture that incorporates such lasers to address the above issues and constraints that limit the transmission performance and enables the construction of a WDM-PON system for high speed multipoint connections across a single fiber with a length greater than, for example, 20 km.

In some implementations, a structure is disclosed that includes a FP cavity semiconductor laser diode, e.g., a FP laser diode, whose optical output passes, optionally, through a Faraday rotator (FR) that rotates the laser polarization by substantially 45 degrees. The laser beam is then coupled into a fiber, e.g., a long optical fiber or polarization maintenance fiber, with a length that, for example, could range from several hundred meters to several kilometers, which connects to a WDM filter, e.g. a DWDM filter, whose optical output is partially reflected by a Faraday rotator mirror (FRM). The FRM is composed of a FR followed by a partially reflective mirror. The transmitted optical signal is used for signal transmission. In some implementations, only a partially reflective mirror is required (e.g., no coupler). The reflected optical signal then passes through the WDM filter and the fiber to reach the FR or the laser diode cavity if no FR is included.

The polarization of the beam reflected by a FRM remains orthogonal with the forward going optical signal at any location in between the FR and the FRM even though the polarization might be distorted when passing through the long and potentially strained fiber. The reflected beam then passes through the FR with its polarization being rotated by the FR before it is injected back into the FP laser cavity. The double passes through the FR and FRM result in a total rotation of the polarization of the reflected beam to 360 degrees which aligns well with the original laser polarization from the FP laser cavity. The FR, optical fiber, WDM filter, the FRM and the front facet of the FP cavity form an external resonant cavity in which the optical field, spectrally purified by the WDM filter, resonates within the external cavity and with the FP cavity, and locks the FP laser into one of the FP cavity modes that aligns with the WDM filter. This resonance relaxes the requirement of the loss budget in the external cavity to lock the FP laser.

Moreover, the implementation of double FR architecture stabilizes the polarization from the long external cavity and locks the wavelength of the FP to a greater extent than previous implementations. As a result, the optical gain in the FP laser cavity does not need to have low polarization dependence. Since the reflected beam is filtered by the WDM filter, the injection back to the FP laser cavity locks its lasing mode to one of the FP cavity modes which coincides with the wavelength window defined by the WDM filter and creates a single mode operation essential for high speed long distance transmission. Typically, the FP laser itself is designed to have reasonably low cavity loss and is operated well above threshold to give an acceptable relative intensity noise (RIN) level with well suppressed spontaneous emission and noise dominated by the mode partition among the multi-longitudinal lasing modes. In some implementations, the RIN is further reduced once the lasing mode is locked to a single mode by filtered external optical feedback injection. With this arrangement, an optical signal that is low noise and less sensitive to refection from the transmission system can be produced. In some implementations, the FP cavity mode is required to be aligned to the WDM filter center. This can be accomplished by controlling the FP cavity temperature. In some implementations, data transmission can be accomplished by directly modulating the current injection into the FP cavity.

Having the FP laser biased well above a threshold can enable high speed modulation, though, such direct current modulation may lead to wavelength chirping and limit the transmission distance due to dispersion in the optical fiber. In some implementations, to resolve this issue an external modulator (EM) is placed in between the FP cavity and the FR. To facilitate the WDM laser source covering a broad wavelength range, the EM can be a broadband modulator. A Mach-Zehnder interferometer (MZI) based intensity modulator can be used as the EM which is typically broadband with high speed modulation capability. A semiconductor optical amplifier (SOA) can also be used in some implementations enabling modulation of the current injection which modulates the optical gain.

In some implementations, the reflected light passing through the EM will be re-modulated which can potentially induce disturbance to the forward going signal modulation in both MZI and SOA modulator instantiations. In addition when using a SOA modulator, the reflected light potentially can affect the saturated optical gain and degrade the quality of the forward signal modulation. With the FP laser operating well above the threshold, the degradation of the forward going signal modulation quality caused by the re-modulation of the back injection light is typically small. In some implementations, further improvement can be achieved where the FR is placed in between the FP and the EM. In this architecture, the reflected beam passing through the EM will have a polarization 45 degrees off compared to the designed polarization of the EM, and thus reduces the effect of re-modulation of the reflected beam passing through the EM. In this configuration, the light injected back to the FP laser remains well aligned with the original polarization to maintain the wavelength locking performance.

In some implementations, the external cavity laser is incorporated into a WDM-PON architecture. In one example configuration an array waveguide grating (AWG) based WDM MUX (or a tunable DWDM filter) replaces the WDM filter in the original structure. The AWG MUX serves the WDM filter function in the external cavity laser structure with each input port of the AWG defining a different lasing wavelength for the FP laser that connects to the specific input port, and combines all the laser inputs together at the output port to facilitate single fiber transmission.

In some implementations, the self-seeding WDM-PON architecture is used for both the optical line termination (OLT) and optical network unit (ONU). To facilitate bidirectional transmission through a single optical fiber, the wavelengths for the OLT transmitters can be allocated in the L-band while the transmitting wavelengths for the ONUs can be allocated in the C-band. A Cyclic AWG can be used to accommodate the different wavelength bands for upstream and downstream MUX and DEMUX through a single optical fiber. WDM couplers can optionally be used in between the transmitter and FR to separate the L-band light in the downstream signal for signal receiving in the ONU transceivers, and to separate the C-band light in the upstream signal for signal receiving in the OLT transceivers. In some implementations, each transceiver unit includes the transmitter, the receiver, the WDM coupler and the FR, which can be integrated, for example, into a small form factor pluggable device along with electronics needed to operate the device with digital data and control interface.

Taking advantage of the nature of the laser architecture, the external cavity FP laser can be seamlessly added to the TDM-PON system as a solitary WDM laser with a single channel WDM filter, or as a group of ONUs using AWG. Since the laser characteristics does not depend on seed light coming from the system such as the OLT side, there is no performance compromise in the laser characteristics from adding it to the existing system.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference numbers and designations in the various drawings indicate like elements.

DETAILED DESCRIPTION

Figure 1:
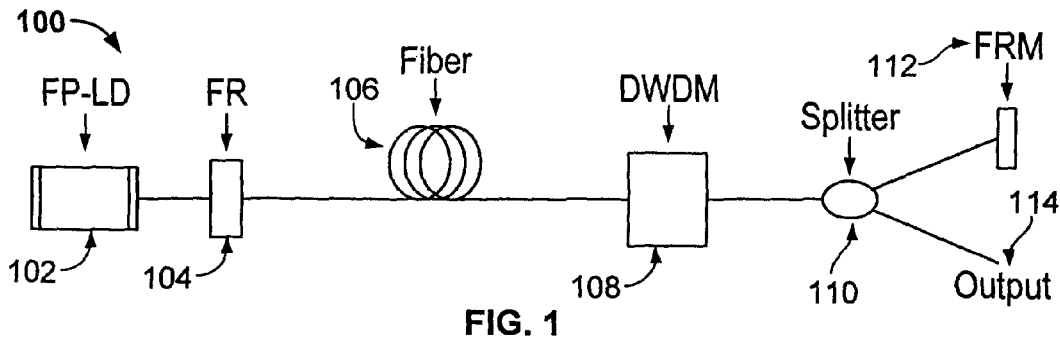
FIG. 1 shows an example of an external cavity coupled FP laser structure with direct modulation.

Referring now to FIG. 1, an example of an external cavity FP laser structure 100 is shown that enables high performance WDM transmission at high speed over a long distance. In the implementation shown, the basic laser structure includes a FP laser cavity, e.g., FP laser diode 102, whose output first passes through a Faraday rotator (FR) 104 and is then coupled into an optical fiber 106 with a length ranging from, for example, several hundred meters to several kilometers. The Faraday rotator (FR) 104 rotates the laser polarization by 45 degrees. In some implementations, no FR is included in the structure. Similarly, the optical fiber can be replaced by a polarization maintenance fiber in some implementations.

The optical fiber 106 is coupled to a wave division multiplexing (WDM) filter 108, e.g., a dense WDM multiplexer, whose output optical signal is coupled through a splitter 110 and partially reflected by a Faraday rotator mirror (FRM) 112. The polarization of the reflected beam is rotated by 270 degrees after transmitting through and reflected by the FRM. The transmitted optical signal is provided as an output 114 and is used for signal transmission. In operation, the reflected laser signal passes through the WDM filter 108 and the FR 104 again and reaches back to the FP cavity at FP laser diode 102.

The double passes through the FR 104 and the FRM 112 result in a total polarization rotation of substantially 360 degrees for the reflected optical signal and enable it to align well with the original laser output from the FP laser cavity, e.g., from FP laser diode 102, that lies in the same polarization plane. This filtered reflection is injected back to the FP laser cavity and locks its lasing mode to one of the FP cavity modes which coincides with the wavelength window defined by the WDM filter 108 and creates a single mode operation essential for high speed long distance transmission. Data transmission can be enabled by directly modulating the current injection into the FP cavity. The optical gain in the FP laser cavity does not need to have low polarization dependence.

Using this type of architecture, the FR, fiber, WDM filter, the FRM, and the front facet of the FP cavity form an external resonant cavity optically coupled to the FP cavity. The optical field spectrally purified by the WDM filter resonates within the external cavity and with the FP cavity and locks the FP laser into one of the FP cavity modes that aligns with the WDM filter. This nature of resonance relaxes the requirement of the loss budget in the external cavity to lock the FP laser effectively. Moreover, the implementation of double FR architecture stabilizes the polarization from the long external cavity and locks the wavelength of FP to a great extent of previous implementations.

In some implementations, no coupler is included, and the output of the WDM multiplexer is provided directly to a partially reflective component. In some implementations, different ways can be used to implement the partial reflection by the FRM. For example, a partially reflective mirror can be used without using the splitter. In another example a two-port array waveguide (AWG) filter can be used in which one port is connected to a FRM while the other port is used for transmission.

In some alternative implementations, the FR can be removed. In this scheme, the polarization in the long cavity is still stabilized but the FP laser diode must have a reasonably low polarization dependent gain (PDG), not very low PDG, since double round-trip passes in the cavity are needed to recover the polarization. A reasonably low PDG will ensure the effective locking of the FP laser wavelength. This is still an improvement over conventional implementation in which the polarization state is not stabilized and as a result, the laser performance is very sensitive to PDG, so very low PDG is required.

In some other implementations, the fiber used is a polarization (PM) fiber and both the FR an FRM are removed from the structure. The PM fibers are used to stabilize the polarization in the long cavity.

In some implementations, the FP cavity mode of the FP laser diode is required to be aligned to the WDM filter, e.g., to the center frequency of the WDM filter, when, for example, they are not inherently aligned. In some implementations, alignment can be achieved by tuning either the FP cavity or the WDM filter. In some implementations, heating elements can be coupled to one or both of the FP laser diode or the WDM filter to accomplish this tuning. Alternatively, one or more thermoelectric coolers (TECs) can be used.

Figure 2:
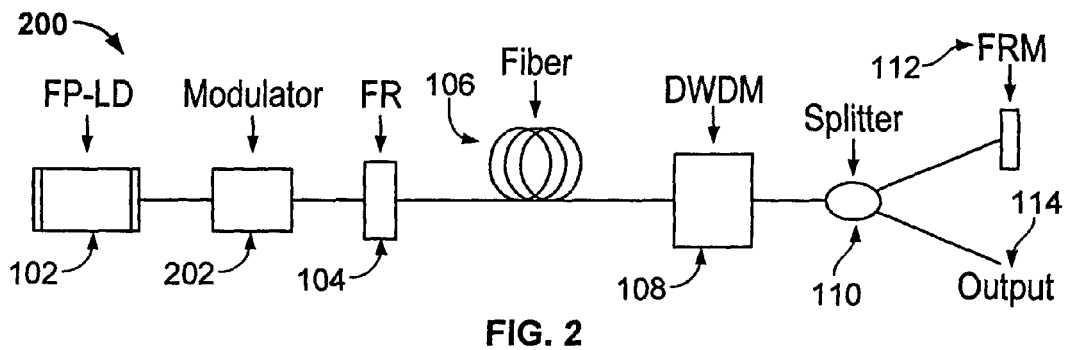
FIG. 2 shows an example of an external cavity coupled FP laser structure with external modulation.

Referring now to FIG. 2, in another implementation, an example self-injection locked FP laser structure 200 with external modulation is shown. An external modulator (EM) 202 is located between the FP laser diode 102 and the FR 104 to achieve higher transmission performance. In some implementations, the EM can be a semiconductor optical amplifier (SOA) or a Mach-Zehnder interferometer (MZI) based intensity modulator. The concern of modulation speed of a SOA being typically slow in the prior RSOA studies is resolved in the proposed architecture. This is attributed to the much higher power injection into the SOA from the FP laser that operates well above threshold, which reduces the carrier lifetime in the SOA and enables the higher speed modulation performance.

Figure 3:
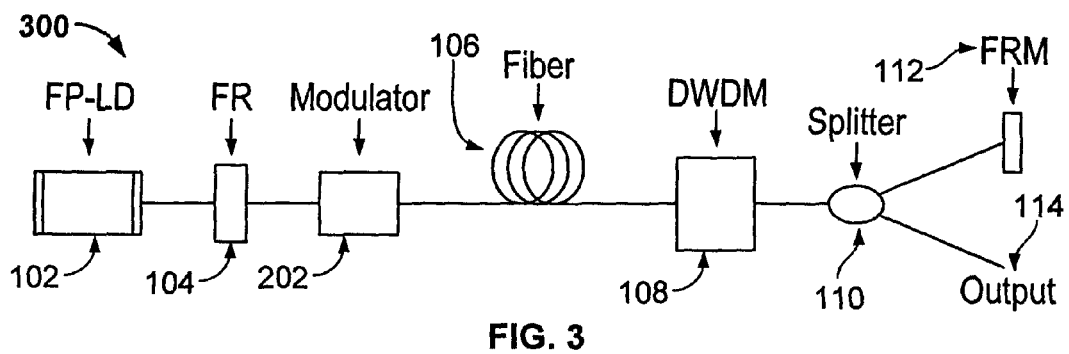
FIG. 3 shows an example of an external cavity coupled FP laser structure with the FR in between the FP laser and the external modulator.

Referring now to FIG. 3, in another implementation, a second example of an external cavity FP laser structure 300 with external modulation is shown. In this example, the FR 104 can be placed in between the FP laser diode 102 and the EM 202. The placement of the FR 104 between the FP laser diode 102 and the EM 202 can reduce the re-modulation of the reflected beam passing through the EM 202. In this architecture, the reflected beam passing through the EM will have a polarization 45 degree off compared to the designed polarization of the EM, and reduces the effect of re-modulation of the reflected beam passing through the EM. Additionally, the light injected back to the FP laser remains well aligned with the original polarization to ensure the wavelength locking effectiveness. By contrast, in the example shown in FIG. 2, the reflected light passing through the EM will be re-modulated, which might induce disturbance to the forward going signal modulation in both MZI and SOA modulator cases. Also in the case of SOA modulator, the reflected light might affect the saturated optical gain and degrade the quality of the forward signal modulation.

With the FP laser operating well above threshold, the degradation of the forward going signal modulation quality caused by the re-modulation of the back injection light should be small since the forward going signal does not come from the regeneration process that amplifies the back injection light but comes directly from the FP laser itself and is much stronger than the back injection light, which is used for locking the FP laser mode. Nevertheless, further improvement may be achieved when using the architecture shown in FIG. 3.

Figure 4:
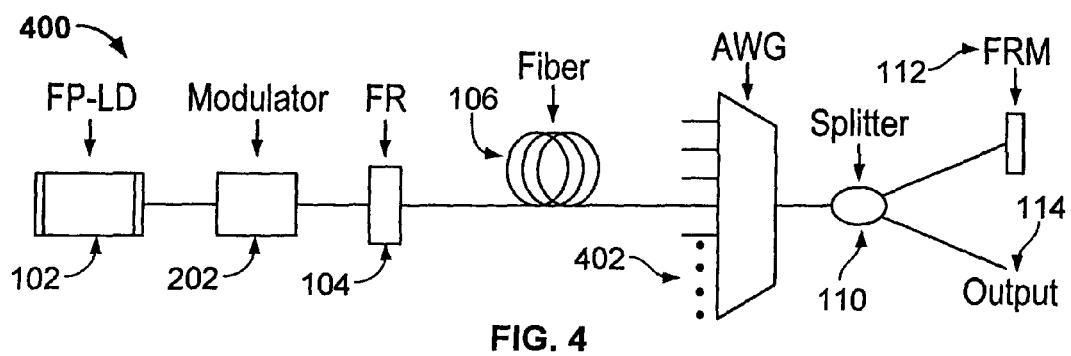
FIG. 4 shows an example of a WDM-PON architecture including an AWG MUX/DEMUX.

Referring now to FIG. 4, in another implementation, an example architecture 400 is shown where the external cavity FP laser diode can be incorporated into a WDM architecture using a multiplexer, e.g., an array waveguide grating (AWG) based WDM MUX 402. The AWG MUX provides the WDM filter function in the external cavity laser structure with each input port of the AWG defining a different lasing wavelength for the FP laser that connect to the specific input port, and combines all the laser inputs together at the output port to facilitate single fiber transmission. In a conventional WDM-PON system, the distance between the WDM MUX/DEMUX and the optical network unit (ONU) users could be in the range of several hundred meters to several kilometers. The implementation of a double FR architecture stabilizes the polarization from the long external cavity and is critical to ensure the effectiveness of wavelength locking of the FP laser. As shown in FIG. 4, the architecture of FIG. 2 is provided where the DWDM multiplexer is replaced with the AWG MUX.

Figure 5:
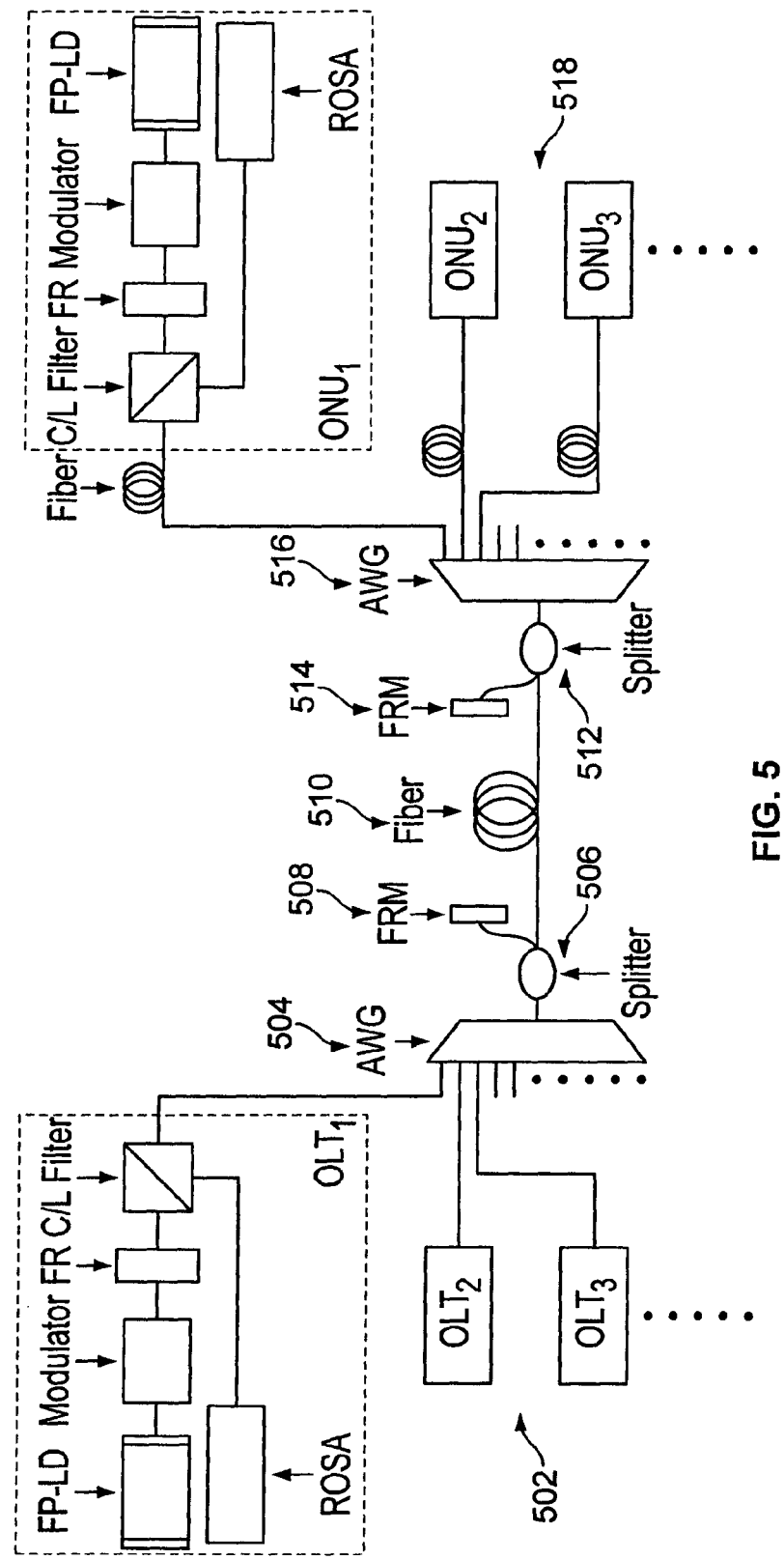
FIG. 5 shows an example of a complete multipoint to multipoint connector through a single optical fiber based on a WDM-PON system.

FIG. 5 shows an example of a complete multipoint to multipoint connector through a single optical fiber based on a WDM-PON system as described above. The wave division multiplexing passive optical network (WDM PON) includes one or more optical line termination (OLT) points 502 coupled to inputs of a first multiplexer 504, e.g., a first array waveguide grating (AWG) multiplexer (MUX). Each optical line termination point 502 includes a FP laser diode, an external modulator (EM) that receives the output optical signal from the FP laser diode and provides the output optical signal as an input to a Faraday rotator. The output of the Faraday rotator can be provided as an input to the first multiplexer 504, e.g., a first AWG MUX. Each optical line termination can also include a receiver optical subassembly (ROSA) as shown. Multiple OLT's 502 can be included in the WDM-PON system, each providing an input to the first multiplexer 504.

The WDM-PON system further includes a first splitter 506 for receiving the optical signal from an output of the first multiplexer 504 and a first Faraday rotator mirror (FRM)

508 coupled to one port of the first splitter 506. As discussed above, a reflected optical signal is reflected back into the FR and EM prior to being injected into the FP laser cavity of the OLT. The second port of the first splitter couples the output optical signal from the OLT to an optical fiber 510 whose other end is coupled to a second splitter 512. The second splitter 512 is configured similarly to the first splitter 506 and has one port coupled to a second Faraday rotator mirror 514 (to produce another reflected optical signal). The input of the second splitter 512 is coupled to an output of a second multiplexer 516, e.g., a second array waveguide grating AWG MUX. The inputs to the second multiplexer 516 are coupled respectively to one or more optical network units (ONU's) 518. In some implementations, each ONU 518 includes a similar structure to the OLT, though different wavelength of light can be used for the laser, including a FP laser diode, an external modulator (EM), and a Faraday rotator (FR). In operation, an optical output of a respective multiplexer is partially reflected by a respective Faraday rotator mirror (FRM) as discussed above.

Figure 6:
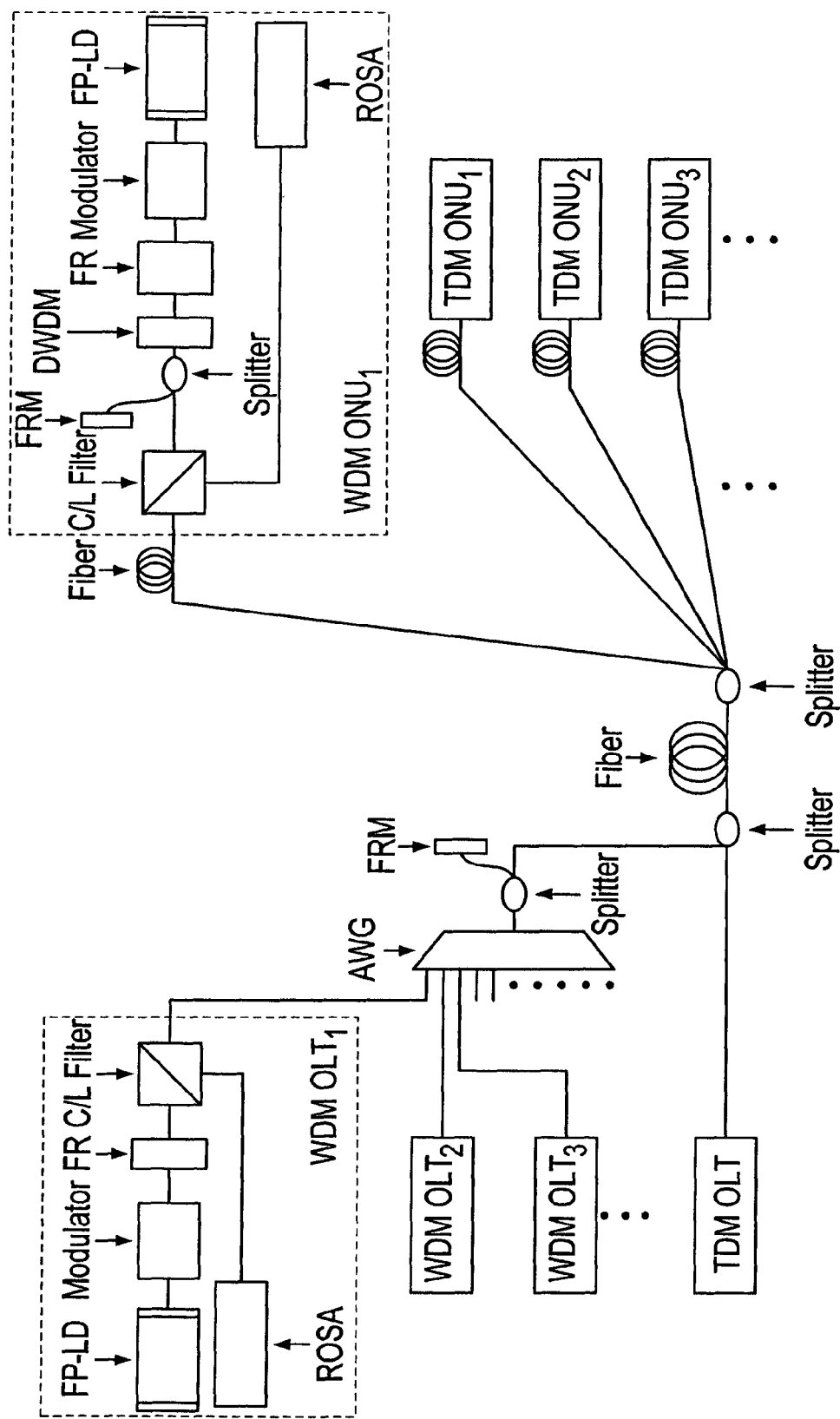
FIG. 6 shows adding a single channel self-injection locked FP laser as a WDM laser into an existing TDM-PON system.
Figure 7:
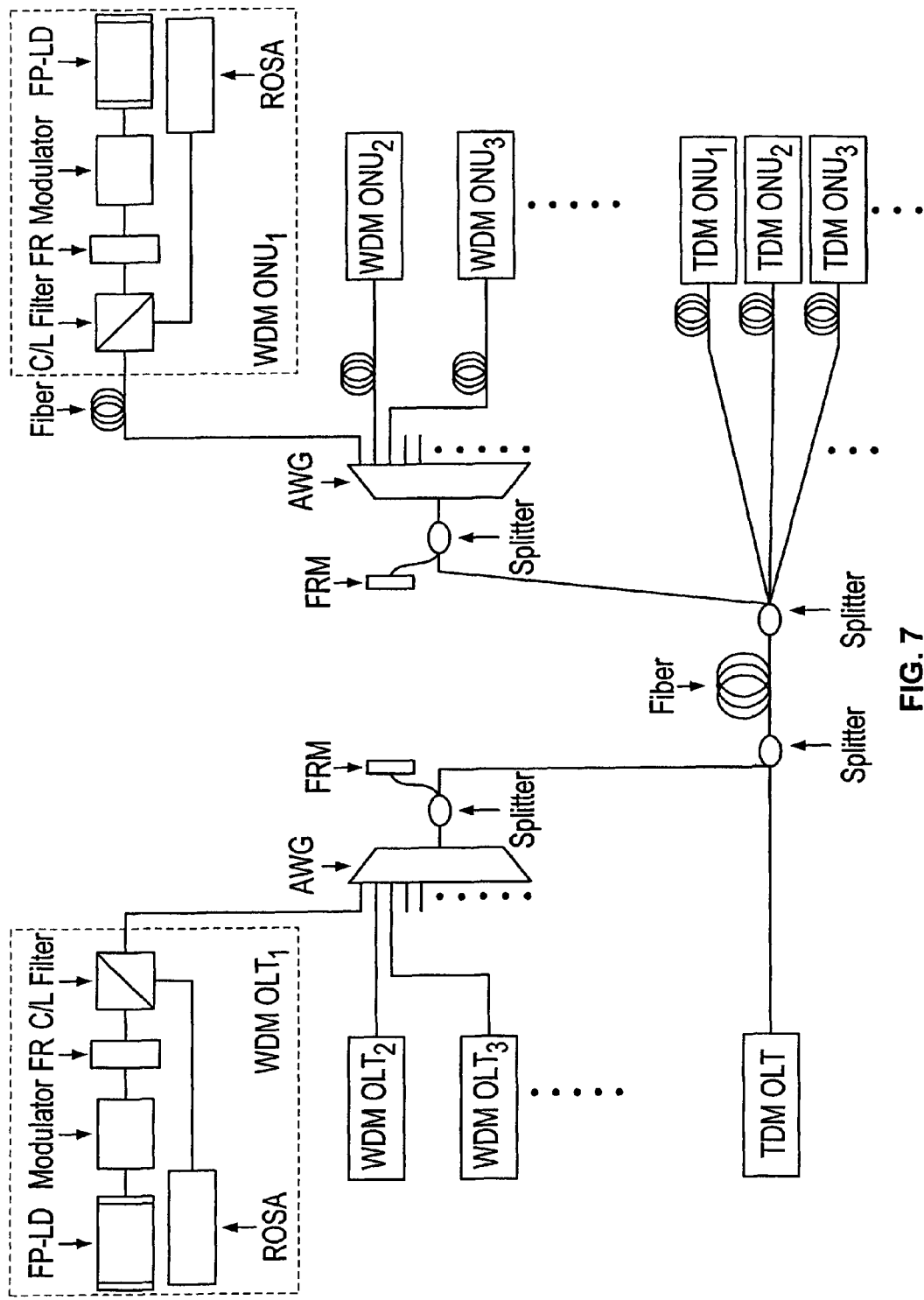
FIG. 7 shows an example for converging a group of self-seeding WDM-PON ONUs into an existing TDM-PON system.

A seamless convergence of the WDM laser and WDM-PON architectures with an existing TDM-PON system can be accomplished without compromising the laser characteristics. FIGS. 6 and 7 show example architectures for integration with an existing TDM-PON system. More specifically, FIG. 6 shows adding a single channel external cavity FP laser as a WDM laser into an existing TDM-PON system.

FIG. 7 shows an example of converging a group of WDM-PON ONUs into an existing TDM-PON system. In yet another implementation, the external cavity FP laser diode can serve as a solitary WDM laser using a single channel DWDM filter.

For some applications, such as the optical line termination (OLT), multiple WDM lasers can all be placed in the same equipment. The construction of the external cavity coupled FP laser can be implemented without the long fiber in between the FP and the WDM filter. Additionally, there is no need to manage the polarization distortion potentially induced by the long and strained fiber.

Figure 8:
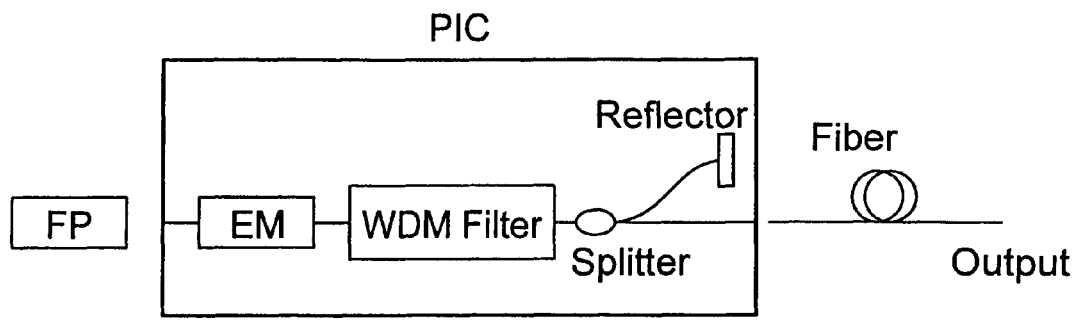
FIG. 8 shows an example WDM laser using a photonic integrated circuit chip.

In some implementations, to implement the WDM laser, a FP laser is coupled to a so called photonic integrated circuit (PIC) chip, which has multiple optical elements integrated on the same substrate. FIG. 8 shows an example WDM laser using a photonic integrated circuit chip.

In such implementations, the PIC chip can contain, sequentially, an EM, a WDM filter, an optical splitter with one arm coupled to a reflector and the other arm coupled to an output end of the PIC chip. All the elements on the PIC chip can be coupled to each other with one or more integrated optical waveguides on the same substrate, which on one end of the PIC, is used to couple to the FP laser, and on the other end, is used to couple to an optical fiber for output applications. Since all elements are integrated on the same chip, polarization is well preserved. In some alternative implementations, to avoid the complexity of the PIC, the splitter and reflector can be moved out of the PIC and placed in the output fiber using, e.g., a short length PM fiber.

Figure 9:
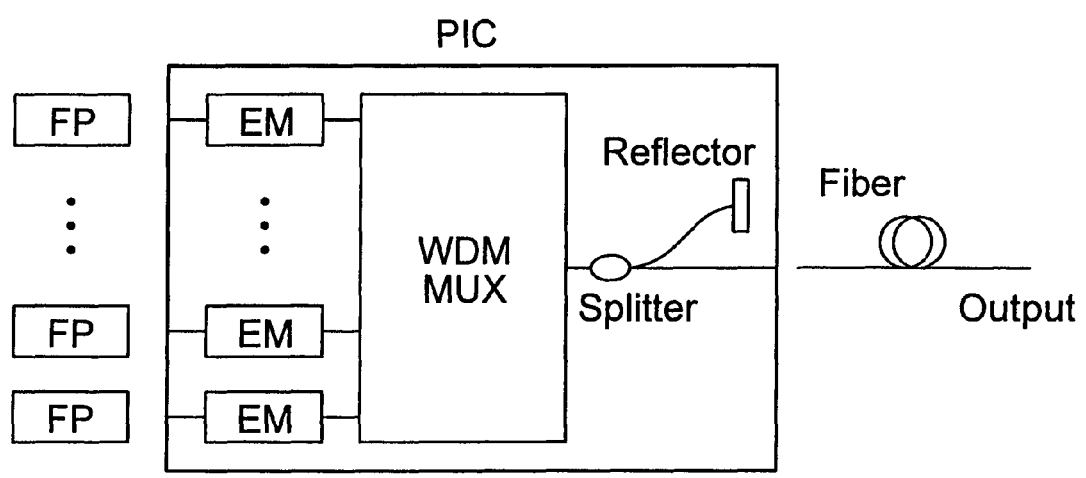
FIG. 9 shows an example WDM laser array.

FIG. 9 shows an example WDM laser array. Since multiple WDM lasers can all be placed in the same OLT equipment, a compact and high density integrated WDM laser array can be implemented by coupling an array of FP lasers to a PIC that contains an array of optical waveguides coupled to an array of EMs on the same PIC substrate. The array of EMs are then coupled to, and are multiplexed by, a WDM MUX, such as AWG, into one waveguide coupled to an optical splitter with one arm coupled to a reflector and the other are coupled to the output end of the same PIC.

While reference is made above to specific structures and apparatus, aspects of the technology may be embodied in one or more methods. In one example method, an optical output from a FP laser diode is provided. The output optical signal is coupled via a fiber (optical or PM fiber) to an optical multiplexer where it is multiplexed to produce a multiplexed signal. The multiplexed signal is optionally split producing a first split signal. The multiplexed signal (or first split signal) is reflected back to a FP laser cavity associated with the FP laser diode. The method includes aligning one FP cavity mode of the FP laser diode with an optical pass band center generated by the optical multiplexer, and locking a FP laser wavelength to single mode operation. The method further includes controlling a polarization of light propagating through the fiber and reflected back to the FP laser diode to be aligned with a polarization of the FP laser diode.

A number of embodiments of the invention have been described. Nevertheless, it will be understood that various modifications may be made without departing from the spirit and scope of the invention. Accordingly, other embodiments are within the scope of the following claims.

What is claimed is:

1. An apparatus comprising:
a Fabry-Perot (FP) laser diode;
a Faraday rotator (FR) coupled to receive an optical output of the FP laser diode and that rotates a polarization of the optical output by substantially 45 degrees;
an external modulator (EM) positioned between the FP laser diode and the Faraday rotator and coupled to receive an optical output of the FP laser diode and to modulate the optical output of the FP laser diode so as to produce a modulated signal;
an optical fiber coupled at a first end to receive an optical output of the FR;
a wave division multiplexer (WDM) filter coupled to a second end of the optical fiber to receive an optical output from the optical fiber; and
a Faraday rotator mirror (FRM) coupled directly or indirectly to an output of the WDM filter,
wherein an optical output of the WDM filter is partially reflected by the FRM such that the polarization of a reflected beam is rotated by substantially 90 degrees after transmission through and reflection by the FRM, and wherein the reflected optical signal then passes through the WDM filter, the optical fiber and passes through the FR with its polarization being rotated by the FR by substantially another 45 degrees before it is injected back into the FP laser diode.

2. The apparatus of claim 1, wherein the WDM filter is of the form of an array waveguide grating (AWG) WDM multiplexer having one input coupled to receive the optical output from the optical fiber and an output coupled to a splitter.

3. The apparatus of claim 1, wherein the WDM filter is a tunable filter.

4. The apparatus of claim 1, wherein the EM is a semiconductor optical amplifier.

5. The apparatus of claim 1, wherein the EM is a Mach-Zehnder interferometer based modulator.

6. The apparatus of claim 1, wherein the optical fiber has a length from several hundred meters to several kilometers.

7. The apparatus of claim 1 further comprising means for aligning a FP cavity mode of the FP laser diode to the WDM filter.

8. The apparatus of claim 7, wherein the means comprise a heating element attached to either one or both of the FP laser diode or the WDM filter.

9. An apparatus comprising:
a Fabry-Perot (FP) laser diode;
a Faraday rotator (FR) coupled to receive an optical output of the FP laser diode and that rotates a polarization of the optical output by substantially 45 degrees;
an optical fiber coupled at a first end to receive an optical output of the FR;
a wave division multiplexer (WDM) filter coupled to a second end of the optical fiber to receive an optical output from the optical fiber; and
a Faraday rotator mirror (FRM) coupled directly or indirectly to an output of the WDM filter,
wherein an optical output of the WDM filter is partially reflected by the FRM such that the polarization of a reflected beam is rotated by substantially 90 degrees after transmission through and reflection by the FRM, and wherein the reflected optical signal then passes through the WDM filter, the optical fiber and passes through the FR with its polarization being rotated by the FR by substantially another 45 degrees before it is injected back into the FP laser diode, and further comprising an external modulator (EM) positioned between the Faraday rotator and optical fiber and coupled to receive an optical output of the Faraday rotator and to modulate the output optical signal so as to produce a modulated signal for transmission by the apparatus.

* * * * *